(12) United States Patent
Lee et al.

(10) Patent No.: US 11,587,611 B2
(45) Date of Patent: Feb. 21, 2023

(54) MEMORY DEVICE WITH INPUT CIRCUIT, OUTPUT CIRCUIT FOR PERFORMING EFFICIENT DATA SEARCHING AND COMPARING WITHIN LARGE-SIZED MEMORY ARRAY

(71) Applicant: MACRONIX INTERNATIONAL CO., LTD., Hsinchu (TW)

(72) Inventors: Ming-Hsiu Lee, Hsinchu (TW); Po-Hao Tseng, Taichung (TW); Yu-Hsuan Lin, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/380,056

(22) Filed: Jul. 20, 2021

(65) Prior Publication Data

US 2023/0022008 A1 Jan. 26, 2023

(51) Int. Cl.
| | | |
|---|---|---|
| *G11C 7/22* | (2006.01) | |
| *G11C 11/4096* | (2006.01) | |
| *G11C 11/4094* | (2006.01) | |
| *G11C 11/408* | (2006.01) | |

(52) U.S. Cl.
CPC ...... *G11C 11/4096* (2013.01); *G11C 11/4085* (2013.01); *G11C 11/4087* (2013.01); *G11C 11/4094* (2013.01)

(58) Field of Classification Search
CPC ............ G11C 11/4096; G11C 11/4085; G11C 11/4087; G11C 11/4094
See application file for complete search history.

(56) References Cited

U.S. PATENT DOCUMENTS

| | | | | |
|---|---|---|---|---|
| 4,670,858 A | * | 6/1987 | Almy ..................... | G11C 15/04 365/49.17 |
| 6,892,273 B1 | | 5/2005 | James et al. | |
| 7,782,645 B1 | * | 8/2010 | Gaddam .............. | G11C 7/1006 365/49.1 |
| 2002/0080665 A1 | * | 6/2002 | Hata ...................... | G11C 15/04 365/200 |
| 2004/0003170 A1 | * | 1/2004 | Gibson ................ | G11C 29/816 711/108 |
| 2015/0070957 A1 | * | 3/2015 | Otsuka ................... | G11C 15/02 365/49.17 |

(Continued)

FOREIGN PATENT DOCUMENTS

| | | |
|---|---|---|
| TW | 200807440 A | 2/2008 |
| TW | 201445567 A | 12/2014 |
| TW | 202115576 A | 4/2021 |

*Primary Examiner* — Mushfique Siddique
(74) *Attorney, Agent, or Firm* — McClure, Qualey & Rodack, LLP

(57) ABSTRACT

A memory device for data searching and a data searching method thereof are provided. The data searching method includes the following steps. A searching word is received and then divided into a plurality of sections. The sections are encoded as a plurality of encoded sections, so that the encoded sections may correspond to a plurality of memory blocks in a memory array. The encoded sections are directed into the memory blocks to perform data comparisons and obtaining a respective result of data comparison. Thereafter, addresses of bit lines which match the searching word are obtained according to respective result of data comparison for each of memory block.

14 Claims, 13 Drawing Sheets

(56) References Cited

U.S. PATENT DOCUMENTS

| | | |
|---|---|---|
| 2018/0122479 A1 | 5/2018 | Akerib et al. |
| 2018/0129756 A1* | 5/2018 | Nishizawa ............. G11C 15/04 |
| 2019/0146873 A1* | 5/2019 | Wu ..................... G06F 11/1068 |
| | | 714/764 |
| 2019/0196979 A1 | 6/2019 | Matsuoka |
| 2019/0370465 A1 | 12/2019 | Zhang |
| 2020/0050565 A1 | 2/2020 | Zhang |
| 2021/0027838 A1* | 1/2021 | Alrod ................. G11C 16/3422 |
| 2021/0064455 A1 | 3/2021 | Akel et al. |
| 2021/0182166 A1 | 6/2021 | Hahn et al. |

* cited by examiner

MEMORY DEVICE WITH INPUT CIRCUIT, OUTPUT CIRCUIT FOR PERFORMING EFFICIENT DATA SEARCHING AND COMPARING WITHIN LARGE-SIZED MEMORY ARRAY

TECHNICAL FIELD

The disclosure relates to a memory device and an operating method thereof, and more particularly, to a memory device for data searching and a data searching method thereof.

BACKGROUND

As progressing of semiconductor technology, memories of various types and structures have been widely employed in electronic devices. Usually, a memory has a type of arrays to effectively address each memory unit, so as to rapidly access huge data stored in the memory array.

However, as capacity of the memory array greatly grows, data searching for data stored in the memory array will consume a great time. Particularly, for the case the target searching word has a greater length, data searching will become much more time-consuming.

In addition, for a large-sized memory array, if complicated data searching is to be performed, huge amounts of peripheral elements will be needed, such as, having to dispose huge amounts of word line drivers, searching line encoders and sense amplifiers for bit lines. Accordingly, it may lead to a large size of the chip of whole memory device and hence an increased cost for manufacturing such memory chip.

The above-mentioned issue refers to a technical problem which is encountered by conventional large-sized memory array, both in operating and in manufacturing.

SUMMARY

To overcome the technical problem of conventional memory array with a large size, the present disclosure provides a technical solution to dispose an input circuit and an output circuit which cooperate with the large-sized memory array, and thereby perform data searching and data comparing within the memory array so that efficiency of data searching may be enhanced.

According to one embodiment, the present disclosure provides a memory device for data searching. The memory device includes a memory array, an input circuit and an output circuit. The memory array has a plurality of memory blocks for storing data respectively and a plurality of bit lines. The input circuit includes a dividing circuit, an encoding circuit and a multiplexing circuit. The dividing circuit receives a searching word and divides the searching word into a plurality of sections. The encoding circuit encodes the sections as a plurality of encoded sections which correspond to the memory blocks respectively. The multiplexing circuit directs the encoded sections to the memory blocks, and data comparison is performed on each of the encoded section with each of the memory block in the memory array to obtain a data comparison result respectively. The output circuit obtains addresses of the bit lines which match the searching word according to each of the data comparison result of each of the memory block.

According to another embodiment, the present disclosure provides another memory device for data searching. The memory device includes a memory array, an input circuit and an output circuit. The memory array has a plurality of memory blocks for storing data respectively and a plurality of bit lines. The input circuit receives and processes a searching word and directs the processed searching word to the memory blocks, and data comparison is performed on the processed searching word with the memory blocks in the memory array to obtain a plurality of data comparison results. The output circuit includes a plurality of processing circuits and a selecting circuit. The processing circuits correspond to the bit lines respectively for processing each of the data comparison result of each of the memory block with respect to each of the bit line. The selecting circuit collects and processes each of the data comparison result of each of the bit line, and obtains addresses of the bit lines which match the searching word according to each of the data comparison result with respect to each of the bit line.

According to still another embodiment, the present disclosure provides a data searching method for a memory device. The data searching method includes the following steps. Receiving a searching word and dividing the searching word into a plurality of sections. Encoding the sections as a plurality of encoded sections which correspond to a plurality of memory blocks of a memory array respectively, the memory array has a plurality of bit lines. Directing the encoded sections to the memory blocks. In the memory array, performing data comparison on each of the encoded section with each of the memory block to obtain a data comparison result respectively. Obtaining addresses of the bit lines which match the searching word according to each of the data comparison result of each of the memory block.

According to an alternative embodiment, the present disclosure provides another data searching method for a memory device. The data searching method includes the following steps. Receiving and processing a searching word. Directing the processed searching word to a plurality of memory blocks of a memory array, wherein the memory array has a plurality of bit lines. With respect to each of the bit line, performing data comparison on the processed searching word with the memory blocks to obtain a plurality of data comparison results. Collecting and processing each of the data comparison result of each of the bit line. Obtaining addresses of the bit lines which match the searching word according to each of the data comparison result with respect to each of the bit line.

With the above technical solution of the present disclosure, various types of processing may be performed on the target searching word by the input circuit, and data comparison result of each of the memory block of the memory array may be collected and processed by the output circuit. Accordingly, efficiency of data searching may be enhanced.

Figure 1:
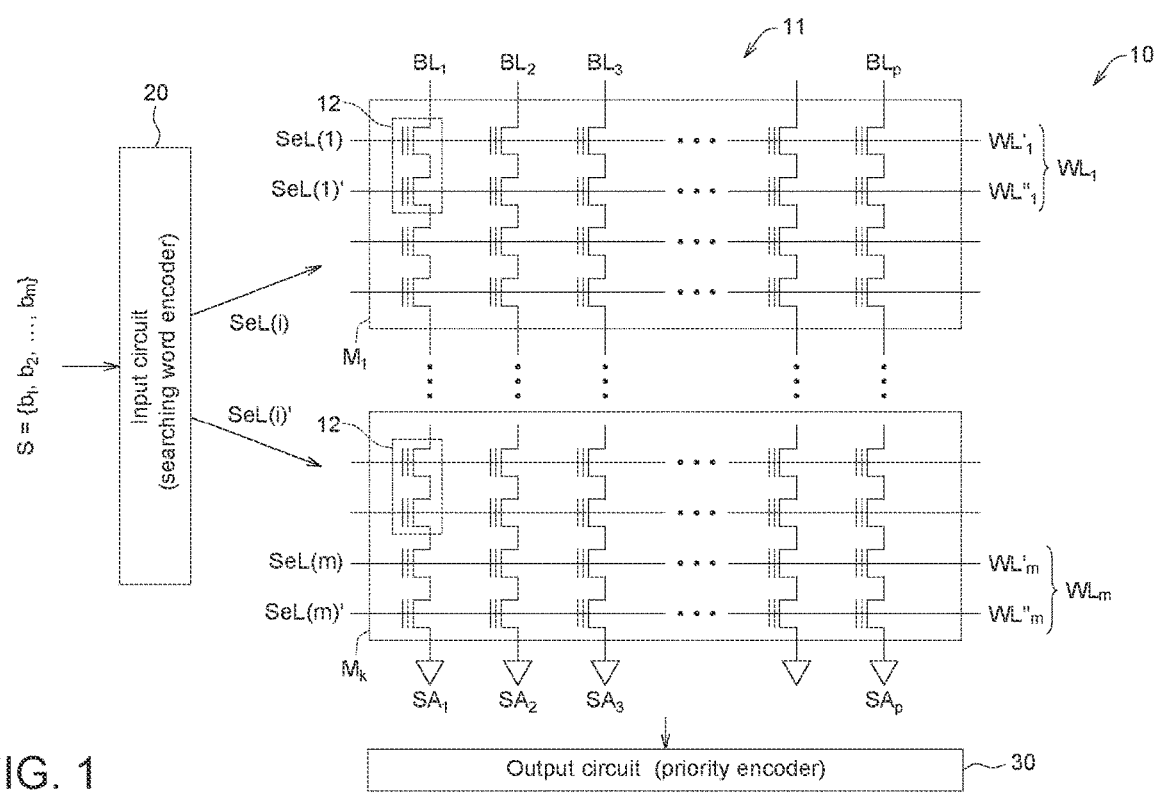
FIG. 1 is a schematic diagram illustrating the overall structure of a memory device 10 for data searching according to the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Detailed descriptions of embodiments of the present disclosure refer to FIGS. 1 to 6C.

FIG. 1 is a schematic diagram illustrating the overall structure of the memory device 10 for data searching according to the present disclosure. Referring to FIG. 1, the memory device 10 includes a memory array 11, an input circuit 20 and an output circuit 30.

The memory array 11 includes a plurality of memory cell units 12, which may be addressed by p bit lines (BL) $BL_1$, $BL_2$, ..., $BL_p$ and m word lines (WL) $WL_1$, $WL_2$, ..., $WL_m$. Each of the word line $WL_i$ may be composed of two physical signals $\{WL'_i, WL''_i\}$. The searching line (SeL) signal which is sent by the input circuit 20 also consists of two physical signals $\{SeL(i), SeL(i)'\}$, that respectively correspond to $\{WL'_i, WL''_i\}$. The memory array 11 may be divided into a plurality of memory blocks, for example, the memory array 11 may be divided into k memory blocks $M_1$, $M_2$, ..., $M_k$ with respect to a second direction (vertical direction).

The memory array 11 may be electrically connected to the input circuit 20 and the output circuit 30. Wherein, the input circuit 20 may be electrically connected to the memory array 11 through the word line $WL_i$. Furthermore, the input circuit 20 transmits the searching line signal $\{SeL(i), SeL(i)'\}$ to the memory array 11 through the word line $WL_i$. On the other hand, the output circuit 30 may be electrically connected to the memory array 11 through the bit lines $BL_j$. Furthermore, each of the bit line $BL_j$ transmits a data comparison result to the output circuit 30 via a corresponding sense amplifier (SA) $S_{Ai}$. The aforementioned data comparison result may refer to a comparison result for data stored in each memory block $M_i$ and a searching word S, with respect to each the bit line $BL_j$.

Specifically, the input circuit 20 may receive the searching word $S=\{b_1, b_2, ..., b_m\}$, and the input circuit 20 may execute one or more input functions to convert the searching word S into searching line signal $\{SeL(i), SeL(i)'\}$. Each the searching line signal $\{SeL(i), SeL(i)'\}$ may be respectively sent to k memory blocks $M_1$, $M_2$, ..., $M_k$ and then compared with the data stored in each the memory block $M_i$ to obtain memory addresses matching the searching word S, so that purpose of data searching may be achieved. Therefore, the input circuit 20 may also be referred to as a "searching word encoder".

The main feature of technical solution of the present disclosure refers to that, the searching word S may be divided into a plurality of sections $S_i$ with shorter lengths, and each the divided section $S_i$ may be compared with only one memory block $M_i$, so that overall searching efficiency of the memory array 11 may be enhanced. After data comparison for each section $S_i$ and its corresponding memory block $M_i$ have been completed, the data comparison result for each the bit line $BL_j$ may be sent to the output circuit 30, with respect to each single bit line $BL_j$.

The output circuit 30 may execute one or more output functions to collect and process data comparison results of the bit lines $BL_j$, and hence select the bit line $BL_j$ which matches the searching word S. Since the output circuit 30 may be used to preferably select addresses of bit lines $BL_j$ having the best data comparison result (completely matching the searching word S or mostly matching the searching word S), the output circuit 30 may also be referred to as a priority encoder.

Figure 2:
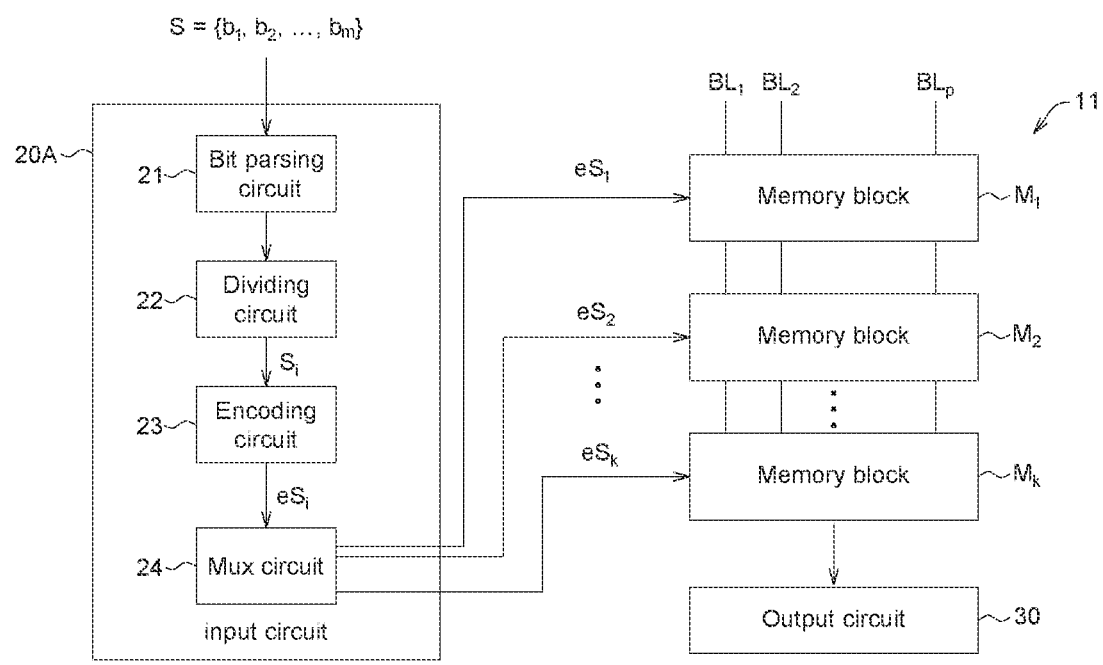
FIG. 2 is a schematic diagram illustrating the structure of the input circuit 20A according to the first embodiment of the present disclosure.
Figure 3A:
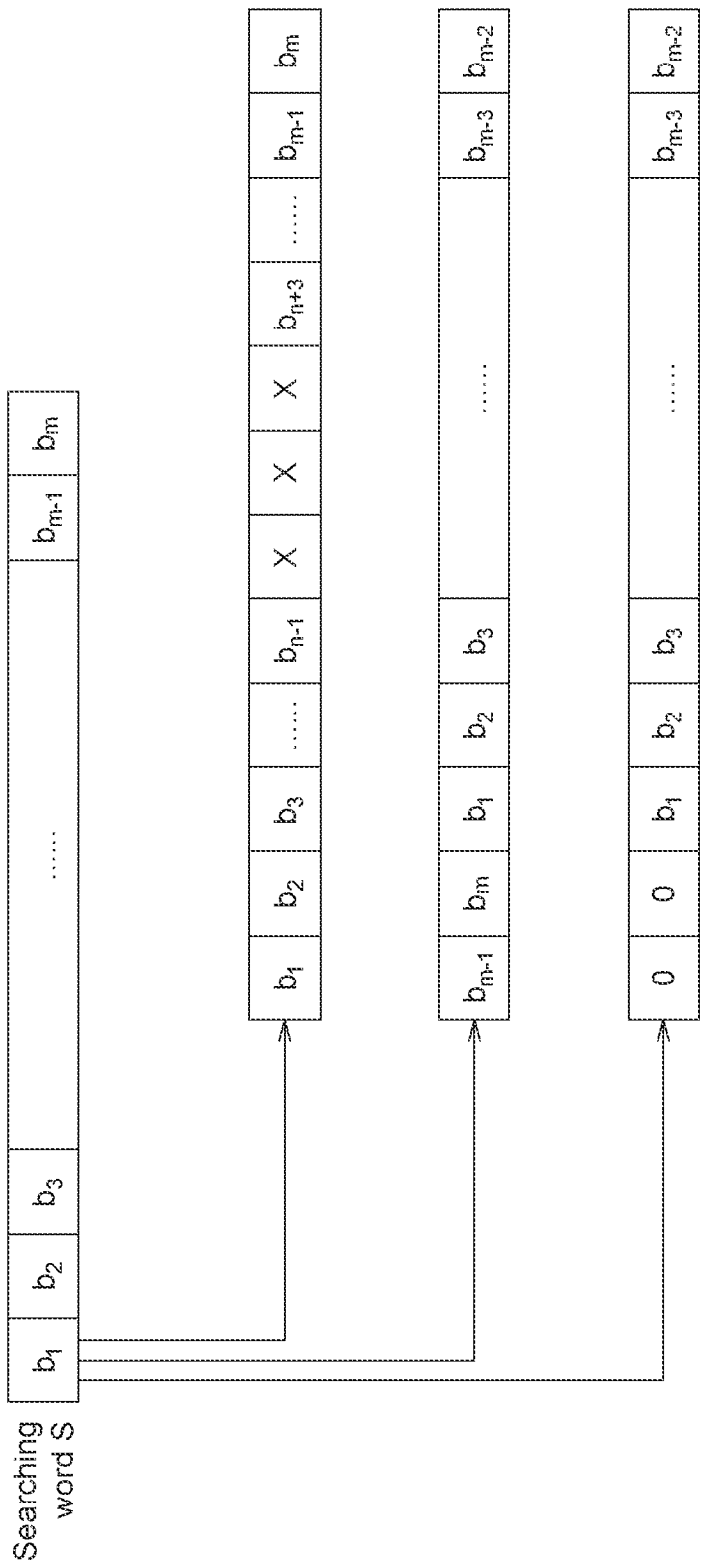
FIGS. 3A and 3B are schematic diagrams illustrating operation of the input circuit 20A according to the first embodiment of the present disclosure.
Figure 3B:
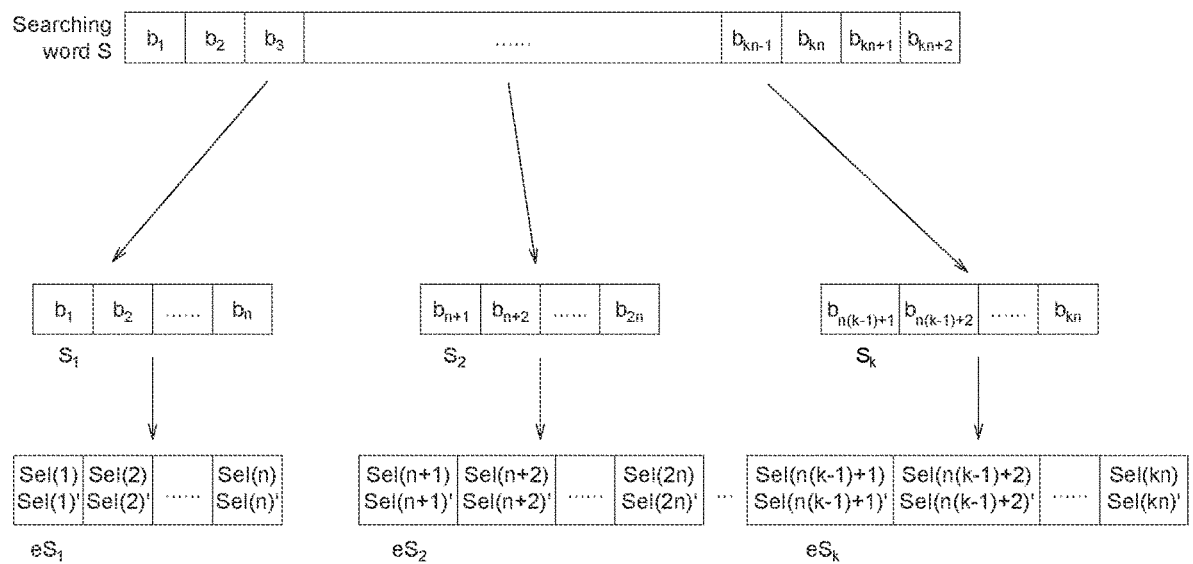

FIG. 2 is a schematic diagram illustrating the structure of the input circuit 20A according to the first embodiment of the present disclosure, and FIGS. 3A and 3B are schematic diagrams illustrating operation of the input circuit 20A according to the first embodiment of the present disclosure. Referring to FIG. 2 and FIGS. 3A and 3B, the input circuit 20A includes a bit parsing circuit 21, a dividing circuit 22, an encoding circuit 23 and a multiplexing circuit 24.

The bit parsing circuit 21 may receive and register the searching word $S=\{b_1, b_2, ..., b_m\}$, and perform bit parsing operation on each bit b1, the bit parsing operation may include masking, rotating or shifting.

In the aspect of masking operation, some bits (such as, the n-th bit to the (n+2)-th bit) of the searching word $S=\{b_1, b_2, ..., b_m\}$, may be masked as wildcard bit 'x' to form searching word $S=\{b_1, b_2, ..., b_{n-1}, x, x, x, b_{n+3}, ..., b_m\}$. Thereafter, as data comparison is performed on the searching word S in the memory array 11, the n-th bit to (n+2)-th bit of the searching word S can be ignored without performing data comparison.

Furthermore, in the aspect of rotating operation, the bits $\{b_i\}$ of the searching word S may be rotated in a clockwise direction (toward the high-bit direction) or counterclockwise direction (toward the low-bit direction). For example: rotating the searching word $S=\{b_1, b_2, ..., b_m\}$ clockwise by two bits to form searching word $S=\{b_{m-1}, b_m, b_1, b_2, ..., b_{m-2}\}$, or rotate the searching word S counterclockwise by two bits to form searching word $S=\{b_3, b_4, ..., b_m, b_1, b_2\}$.

In the aspect of shifting operation, the bits $\{b_i\}$ of the searching word S may be shifted toward the high-bit direction or toward the low-bit direction. For example: the searching word $S=\{b_1, b_2, ..., b_m\}$ may be shifted toward the higher bit by two bits to form searching word $S=\{0, 0, b_1, b_2, ..., b_{m-2}\}$, or shifted toward the lower bit by two bits to form searching word $S=\{b_3, b_4, ..., b_m, 0, 0\}$. In other aspects, the filling bit of the vacancy or blank after shifting may also be "1" or 'x'. For example, shifting toward the lower bit by two bits to form searching word $S=\{b_3, b_4, ..., b_m, 1, 1\}$ or to form searching word $S=\{b_3, b_4, ..., b_m, x, x\}$.

By means of masking, rotating or shifting operations performed by the bit parsing circuit 21, the processed searching word S can meet various bias conditions of word lines WL and hence flexibly correspond to addresses of word lines WL of the array 11.

The dividing circuit 22 may divide the searching word S into k sections $S_1, S_2, \ldots, S_k$, which correspond to k memory blocks $M_1, M_2, \ldots, M_k$ of the memory array 11, respectively. In one aspect, each the segments $S_1, S_2, \ldots, S_k$ may have equal lengths (all with a length of n-bits). Accordingly, the first section $S_1=\{b_1, b_2, \ldots, b_n\}$ may correspond to n memory cells of the memory block $M_1$. Likewise, the second section $S_2=\{b_{n+1}, b_{n+2}, \ldots, b_{2n}\}$ may correspond to n memory cells of the memory block $M_2$.

In the above aspects, total length of the searching word S is m=k×n bits, which is a multiple of total number k of memory blocks. On the other hand, if the total length of the searching word S is not a multiple of the total number k of memory blocks, for example, the total length of the searching word S is m=k×n+2 bits, the last two bits $\{b_{kn+1}, b_{n+2}\}$ of the searching word S are ignored without performing data comparison.

The encoding circuit 22 may perform encoding operation to each the sections $S_1, S_2, \ldots, S_k$ to obtain encoded sections $eS_1, eS_2, \ldots, eS_k$ which may respectively correspond to word lines $WL_i$ of the memory blocks $M_1, M_2, \ldots, M_k$. For example, each bit $\{b_i\}$ in the first section $S_1=\{b_1, b_2, \ldots, b_n\}$ may be encoded as a pair of searching line signals $\{SeL(i), SeL(i)'\}$ which may correspond to word line $WL_i$ in the memory block $M_1$. Each bit $\{bi\}$ may be encoded as different logical values according to different encoding schemes. For example, as the bit $\{b_i\}$ refers to a logical value "1", the searching line signal $\{SeL(i), SeL(i)'\}$ may be encoded as $\{0,1\}$. Furthermore, as the bit $\{b_i\}$ refers to a logical value "0", the searching line signal $\{SeL(i), SeL(i)'\}$ may be encoded as $\{1,0\}$.

The multiplexing circuit 24 may direct each encoded section $eS_1, eS_2, \ldots, eS_k$ to corresponding memory blocks $M_1, M_2, \ldots, M_k$. For example, the encoded section $eS_1$ may be directed to the memory block $M_1$, and hence the searching line signal in the encoded section $eS_1$ that $\{SeL(1), SeL(1)', SeL(2), SeL(2)', \ldots, SeL(n), SeL(n)'\}$ may correspond to n memory cells in the memory block M1 for performing data comparison.

Figure 4A:
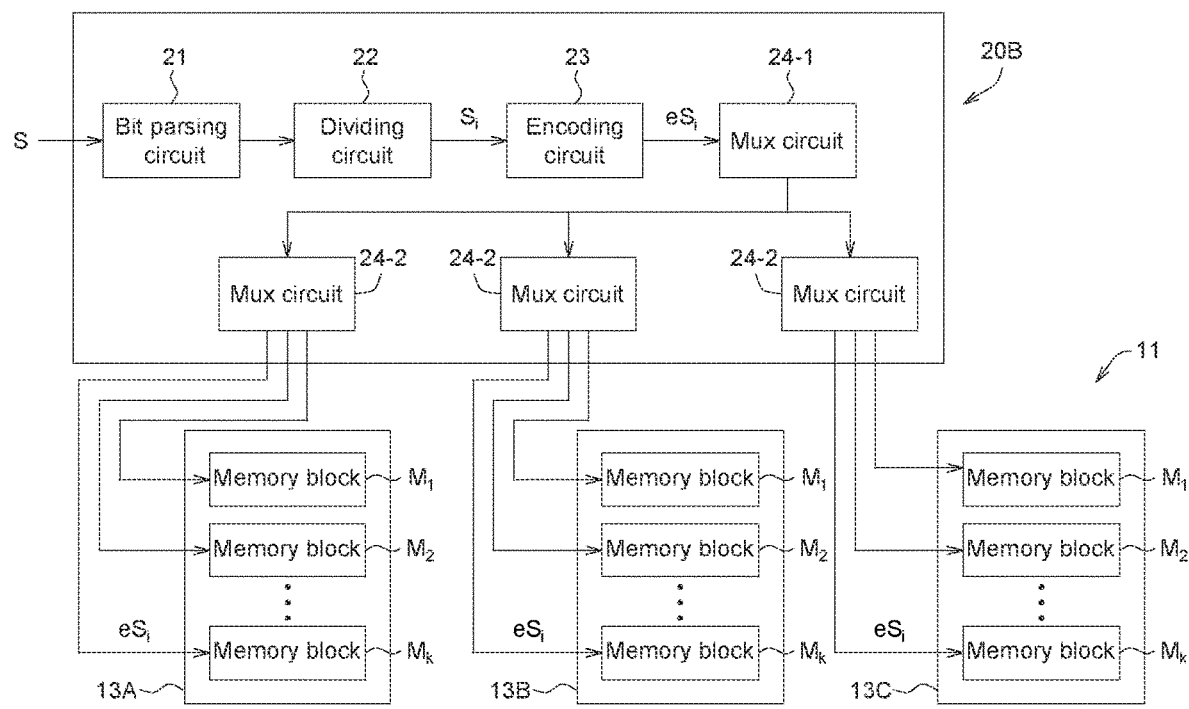
FIG. 4A is a schematic diagram of the structure of the input circuit 20B according to the second embodiment of the present disclosure.

FIG. 4A is a schematic diagram of the structure of the input circuit 20B according to the second embodiment of the present disclosure. As shown in FIG. 4A, the input circuit 20B of the second embodiment may perform hierarchical multiplexing. For example, The memory array 11 may be divided into a plurality of memory sub-arrays 13A,13B,13C where each memory sub-array may include a plurality of memory blocks $M_1, M_2, \ldots, M_k$. More particularly, the memory array 11 may be divided into memory sub-arrays 13A, 13B and 13C with respect to a first direction (such as, the horizontal direction) of the memory array 11. Furthermore, each the memory sub-array 13A,13B,13C may be divided into memory blocks $M_1, M_2, \ldots, M_k$ with respect to the second direction (such as, the vertical direction) of the memory array 11. In other words, each the memory sub-array 13A,13B,13C may include a plurality of memory blocks $M_1, M_2, \ldots, M_k$. However, it is noted that, each the memory blocks $M_1, M_2, \ldots, M_k$ of the second embodiment may only span a range within a memory sub-array. Unlike the memory blocks $M_1, M_2, \ldots, M_k$ of the first embodiment shown in FIGS. 1 and 2, they may span a range across the whole memory array 11.

The multiplexing circuit of the second embodiment may include a first multiplexing circuit 24-1 and a plurality of second multiplexing circuits 24-2. The first multiplexer circuit 24-1 may direct encoded sections $eS_i$ to the second multiplexer circuits 24-2, and then direct to different memory blocks $M_i$ of memory sub-arrays 13A,13B,13C through corresponding second multiplexer circuit 24-2.

Figure 4B:
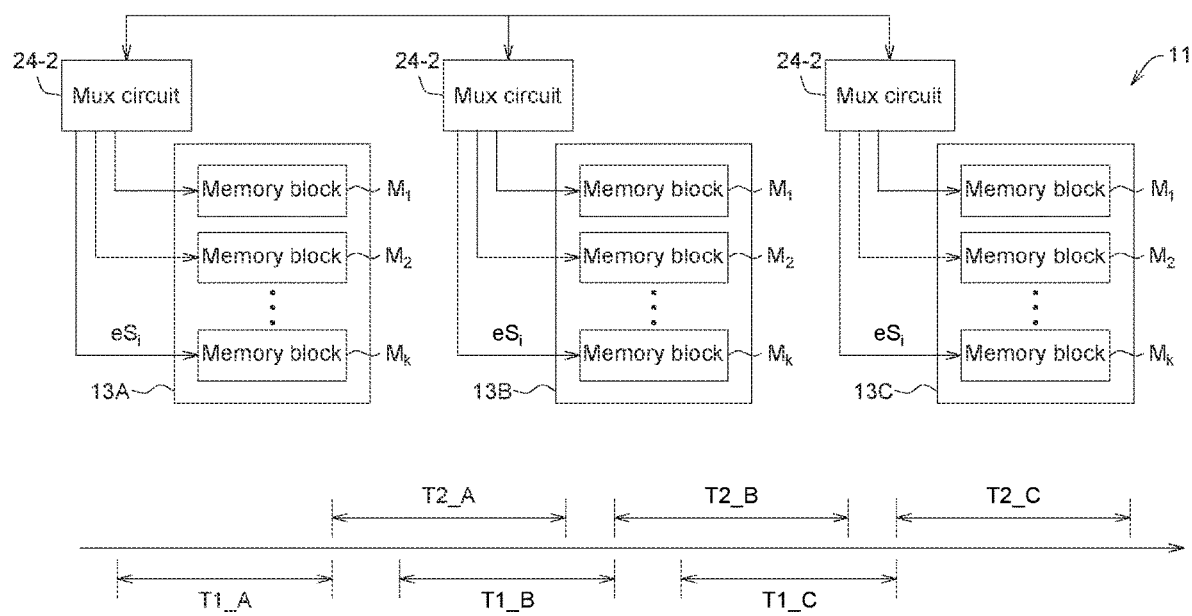
FIG. 4B is a schematic diagram illustrating operation of the input circuit 20B according to a second embodiment of the present disclosure.

FIG. 4B is a schematic diagram illustrating operation of input circuit 20B according to a second embodiment of the present disclosure. As shown in FIG. 4B, the encoded sections $eS_i$ of the searching word S may be compared in memory sub-arrays 13A,13B,13C in a time divisional and interlacing manner. Wherein, each memory sub-array 13A, 13B,13C may be sequentially compared in different time periods, and only one memory sub-array may be compared in one time period.

In addition, as the previous memory sub-array 13A is performed data comparison and hence its word lines WL is under sensing, the next memory sub-array 13B may simultaneously set up its word lines WL. For example, sensing time of word lines WL of memory sub-array 13A, 13B, 13C refers to T2_A, T2_B, T2_C. Setup time for memory sub-array 13A, 13B, 13C refers to T1_A, T1_B, T1_C., the sensing time T2_A of the word lines WL of the previous memory sub-array 13A may be overlapped with the setup time T1_B of next memory sub-array 13B, which may be arranged in a manner of pipeline (i.e., which may be performed by way of time-divisional and interlacing), so that overall time of data comparison time for the memory array 11 may be reduced. Similarly, the sensing time T2_B of the word lines WL of the memory sub-array 13B may be overlapped with the setup time T1_C of still next memory sub-array 13C.

Figure 5A:
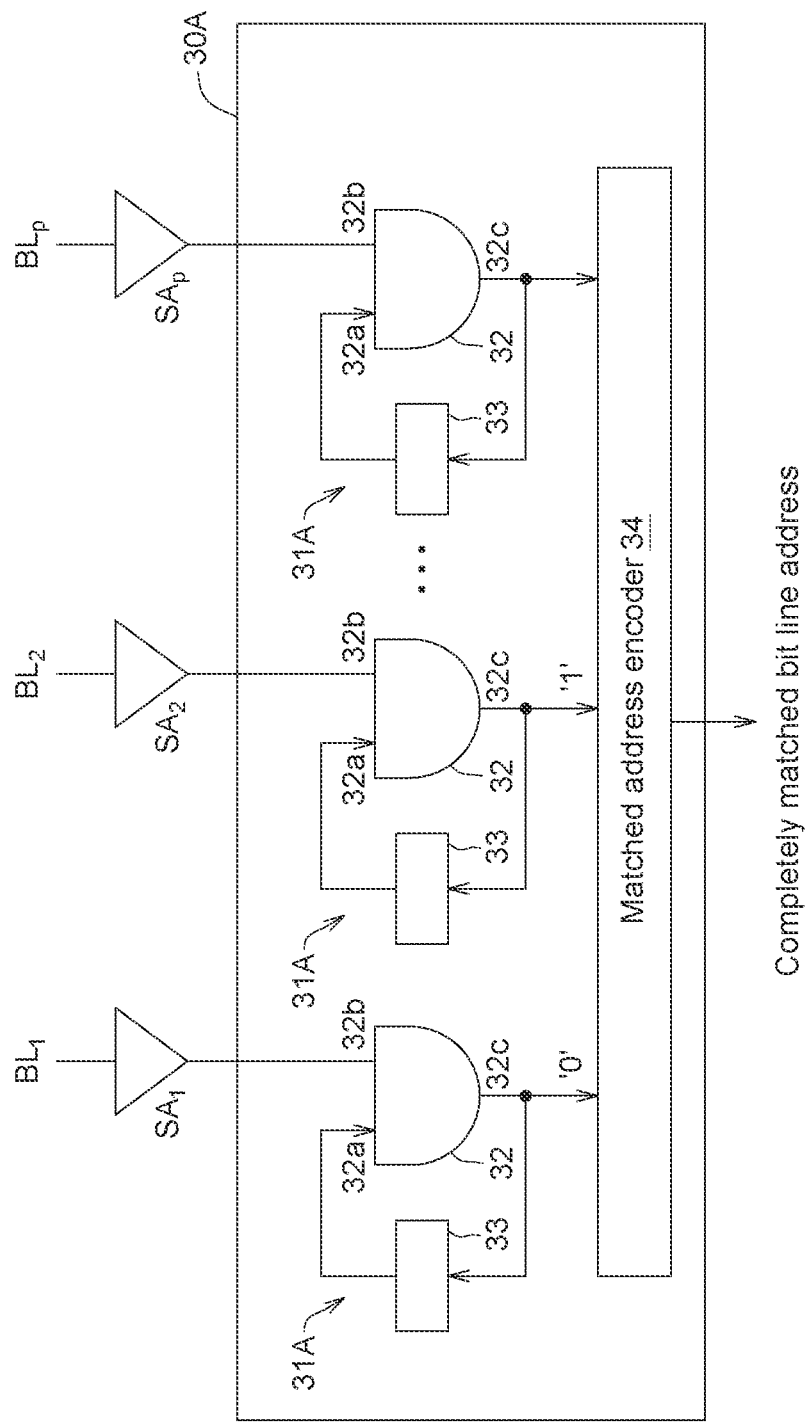
FIG. 5A is a schematic diagram illustrating the structure of the output circuit 30A according to the first embodiment of the present disclosure.

FIG. 5A is a schematic diagram illustrating the structure of output circuit 30A according to the first embodiment of the present disclosure. Referring to FIG. 5A, the output circuit 30A of the first embodiment may include a plurality of processing circuits 31A. Each processing circuit 31A may correspond to a bit line $BL_j$ and may be electrically connected to a sense amplifier (SA) $SA_i$ corresponding to the bit line $BL_j$.

In the first embodiment, each processing circuit 31A may include a logic gate and a storage. Wherein, the storage may be configured to store a logic value, the stored logic value may be "1" or "0", and the stored logic value may be updated in different time periods. Logic value "1" indicates logic "TRUE", and logic value "0" indicates "FALSE". According to definition of positive voltage, logic value "1" refers to high voltage, and logic value "0" refers to low voltage. In contrast, according to definition of negative voltage, logic value "1" refers to low voltage, and logic value "0" refers to high voltage. In one aspect, the storage may be, for example, a register 33. Furthermore, the logic gate may be, for example, an AND gate 32. The AND gate 32 may perform a logic "AND" operation on the logic value "1" or logic value "0".

The first input terminal 32a of the AND gate 32 may be electrically connected to the output terminal of the register 33, and the second input terminal 32b of the AND gate 32 may be electrically connected to the output terminal of the sense amplifier $SA_i$. Furthermore, the output terminal 32c of the AND gate 32 may be fed back to the input terminal of the register 33. In other words, the connection between the AND gate 32 and the register 33 may form a loop, so that the output value of the AND gate 32 may be restored to the register 33 in different time periods to update the logic value stored in the register 33.

Figure 5B:
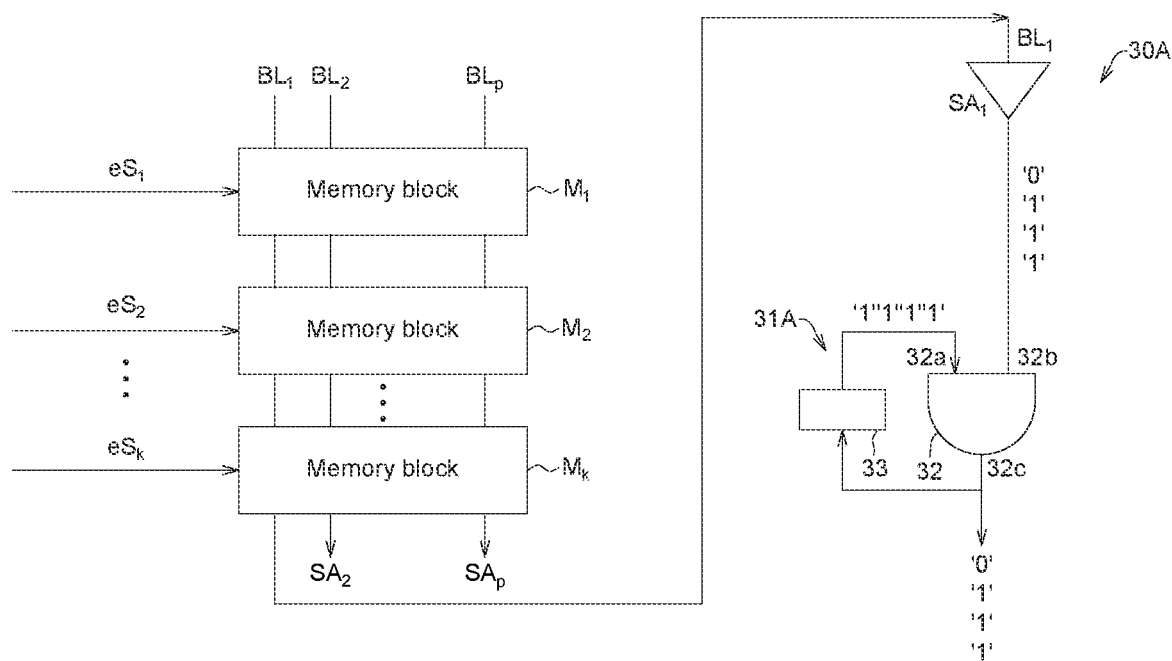
FIG. 5B is a schematic diagram illustrating operation of the output circuit 30A according to the first embodiment of the present disclosure.

FIG. 5B is a schematic diagram illustrating operation of the output circuit 30A according to the first embodiment of the present disclosure. Referring to FIG. 5B, taking the first bit line BL1 as an example to describe operation of the output circuit 30A. Before data comparison of searching word S with memory blocks $M_1, M_2, \ldots, M_k$, the initial value of the register 33 is logical value "1", and the register 33 may output the logic value "1" to the first input terminal 32a of the AND gate 32.

Thereafter, each encoded section $eS_1, eS_2, \ldots, eS_k$ of the searching word S may be compared with memory blocks $M_1, M_2, \ldots, M_k$, by order. First, taking the first bit line BL1 as an example, the encoded section $eS_1$ is compared with memory block $M_1$. If the encoded section $eS_1$ matches data of the first bit line BL1 of memory block $M_1$, the sense amplifier $SA_1$ corresponding to the first bit line $BL_1$ may output logical value "1", and the logical value "1" is sent to the second input terminal 32b of the AND gate 32. Meanwhile, the first input terminal 32a and the second input terminal 32b of the AND gate 32 may both appear logic value "1", and hence logic "AND" operation of the AND gate 32 may obtain a logic operation result of logical value "1", and then be restored to the register 33.

Then, in the subsequent time periods, the subsequent encoded sections $eS_2, eS_3$ are sequentially compared with data of memory blocks $M_2, M_3$. If encoded sections $eS_2, eS_3$ match data of the first bit line $BL_1$ of memory blocks $M_2$, $M_3$, the amplifier $SA_1$ may both output logical values "1". Since the logic value stored in the register 33 in the previous time period is "1", the logic operation result of the AND gate 32 remains as logical value "1".

Moreover, in a later time period, a later encoded section $eS_4$ is compared with of the first bit line $BL_1$ of memory block $M_4$. If the encoded section eS4 does not match data of the first bit line $BL_1$ of memory block $M_4$, the sense amplifier $SA_1$ will output logical value "0". At this time, the logic operation result of the AND gate 32 is changed to logical value "0", and such an logic operation result may be restored to the register 33, again.

In this manner, the register 33 may store the result of logic operation in the current time period, and the AND gate 32 may perform an logic "AND" operation on the currently stored logic operation result and next data comparison result (i.e., data comparison result in the next time period for next encoded section $eS_5$ and next memory block $M_5$) so as to obtain the next logic operation result. Furthermore, the next logic operation result may be restored to the register 33, updating the logic value stored in the register 33 and replacing the logic operation result stored in the previous time period.

The above-mentioned operations may be performed to bit lines $BL_1 \sim BL_p$ simultaneously, and these operations may be repeated for memory blocks $M_1 \sim M_k$ until the last data comparison result (i.e., data comparison result for the last encoded section $eS_k$ and the last memory block $M_k$) has been performed with an logic "AND" operation, and the last logic operation result has been stored in the register 33.

In the output circuit 30A of the first embodiment, only one AND gate 32 and one register 33 are needed for each bit line $BL_j$ to sequentially store and update data comparison result of each memory block $M_i$ in order (in the order of memory blocks $M_1, M_2, M_3 \ldots$).

From the above, if any memory block $M_i$ on bit line $BL_j$ being not matching its corresponding encoded section $eS_i$ of the searching word S, the logic operation result of AND gate 32 appears logical value "0". It is required that all memory blocks $M_i$ on line $BL_j$ match the searching word S, the logic operation result of AND gate 32 will appear logical value "11". Referring again to FIG. 5A, the output circuit 30A may further comprise a selecting circuit to collect each logic operation result stored in register 33 for each bit line $BL_j$, and the selection circuit may select the bit line (e.g. bit line $BL_2$) with logic operation result of logical value "1". The selected bit line may completely match the searching word S (or refers to "all-matched"). In one aspect, the selecting circuit may refer to a matching address encoder 34, which may further calculate and output address of selected bit line $BL_2$. Since the output circuit 30A may be used to preferably select bit lines which completely match the searching word S, the output circuit 30A may also be referred to as a "priority encoder".

Figure 5C:
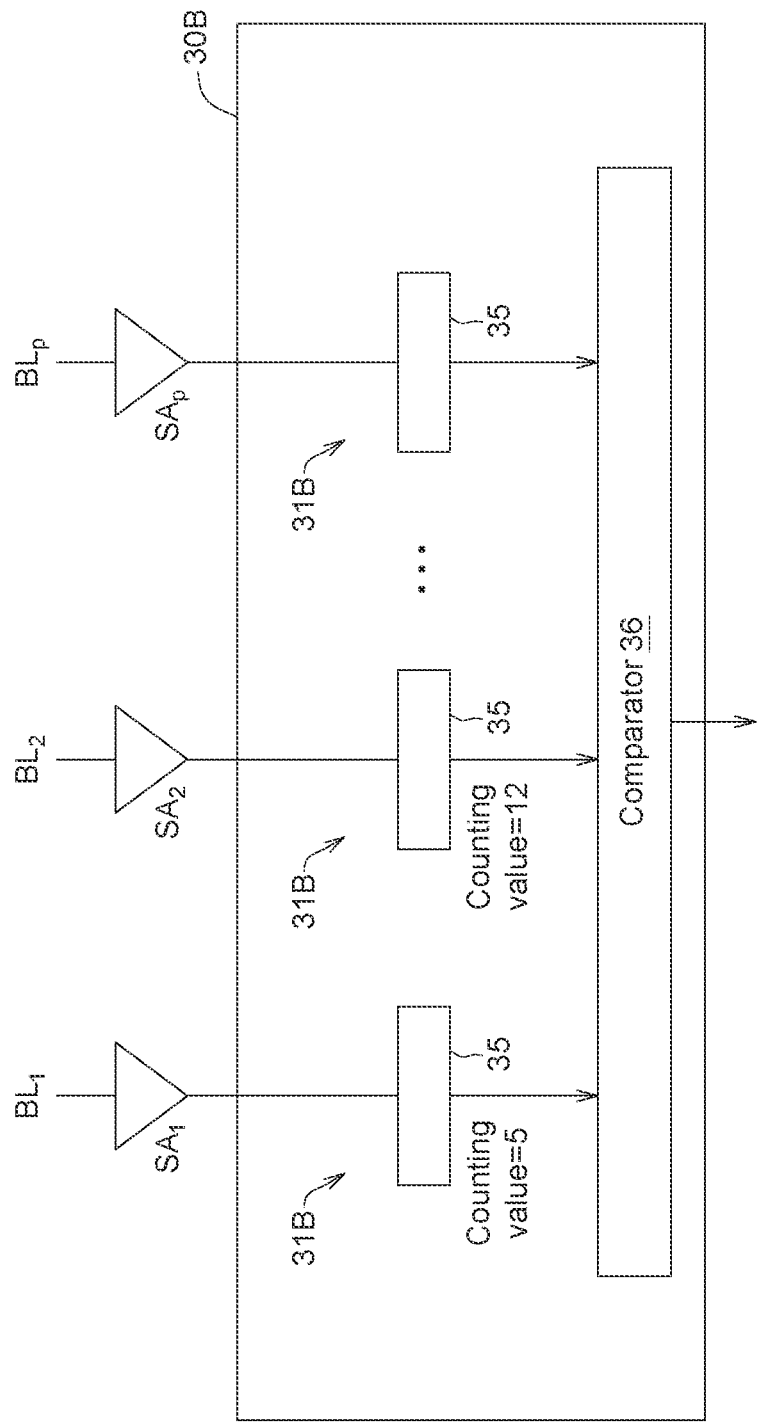
FIG. 5C is a schematic diagram illustrating the structure of the output circuit 30B according to the second embodiment of the present disclosure.

FIG. 5C is a schematic diagram illustrating structure of the output circuit 30B according to the second embodiment of the present disclosure. Referring to FIG. 5C, the output circuit 30B of the second embodiment may also comprise a plurality of processing circuits 31B, which may be electrically connected to sense amplifier $SA_i$ of the corresponding bit line $BL_j$ respectively.

In the second embodiment, each processing circuit 31B may comprise a counter 35, which may count data comparison results for memory blocks Mi on bit line $BL_j$ and the searching word S. For example, if five memory blocks $M_1$, $M_4, M_5, M_8, M_{11}$ on the first bit line $BL_1$ match their corresponding encoded sections $eS_1, eS_4, eS_5, eS_8, eS_{11}$ of the searching word S, the counter 35 of the first bit line BL1 may accumulate five times to obtain a counting value of "five". Likewise, if twelve memory blocks $M_i$ on the second bit line $BL_2$ match their corresponding encoded sections of the searching word S, the counting value of counter 35 of the second bit line $BL_2$ will be "twelve".

In addition, the selecting circuit of the output circuit 30B of the second embodiment may refer to a comparator 36, which may collect counting result of counter 35 for each bit line $BL_j$, and may compare all counting results to select counting values which meet required targets (e.g., the highest counting value, the lowest counting value, or counting values greater than a predefined value). For example, the comparator 36 may select bit line $BL_2$ with the highest counting value of "twelve".

Although, not all memory blocks on the selected bit line $BL_2$ match the searching word S, however, the selected bit line $BL_2$ has the highest amounts of memory blocks (hence with the highest counting value) which match the searching word S. Accordingly, the selected bit line $BL_2$ may be mostly matching the searching word S. Furthermore, the comparator 36 may calculate and output address of the selected bit line $BL_2$.

Figure 5D:
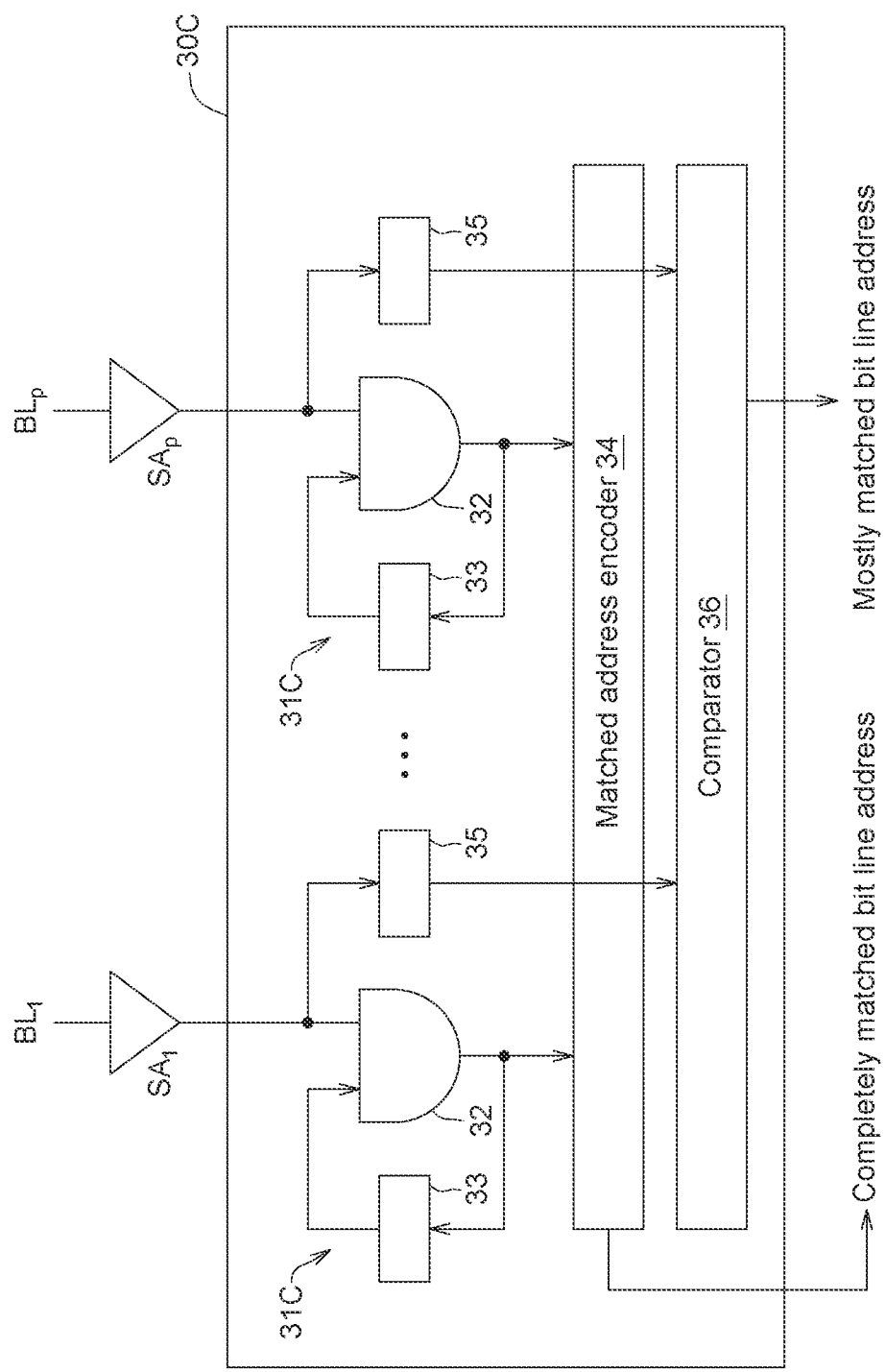
FIG. 5D is a schematic diagram illustrating the structure of the output circuit 30C according to the third embodiment of the present disclosure.

FIG. 5D is a schematic diagram illustrating the structure of the output circuit 30C according to the third embodiment of the present disclosure. Referring to FIG. 5D, the output circuit 30C of the third embodiment may comprise the aspects of both the first and second embodiments. Wherein, processing circuit 31C corresponding to each bit line $BL_j$ may comprise an AND gate 32, a register 33 and a counter 35. Furthermore, output terminal of the sense amplifier $SA_j$ of each bit line $BL_j$ may be connected to the AND gate 32 and the counter 35.

Specifically, logic operation result of each AND gate 32 may be sent to matching address encoder 34 to obtain address of bit line $BL_j$ that completely matches the searching word S. On the other hand, counting value of each counter 35 may be sent to comparator 36 to obtain address of bit line $BL_j$ that mostly matches the searching word S.

Figure 6A:
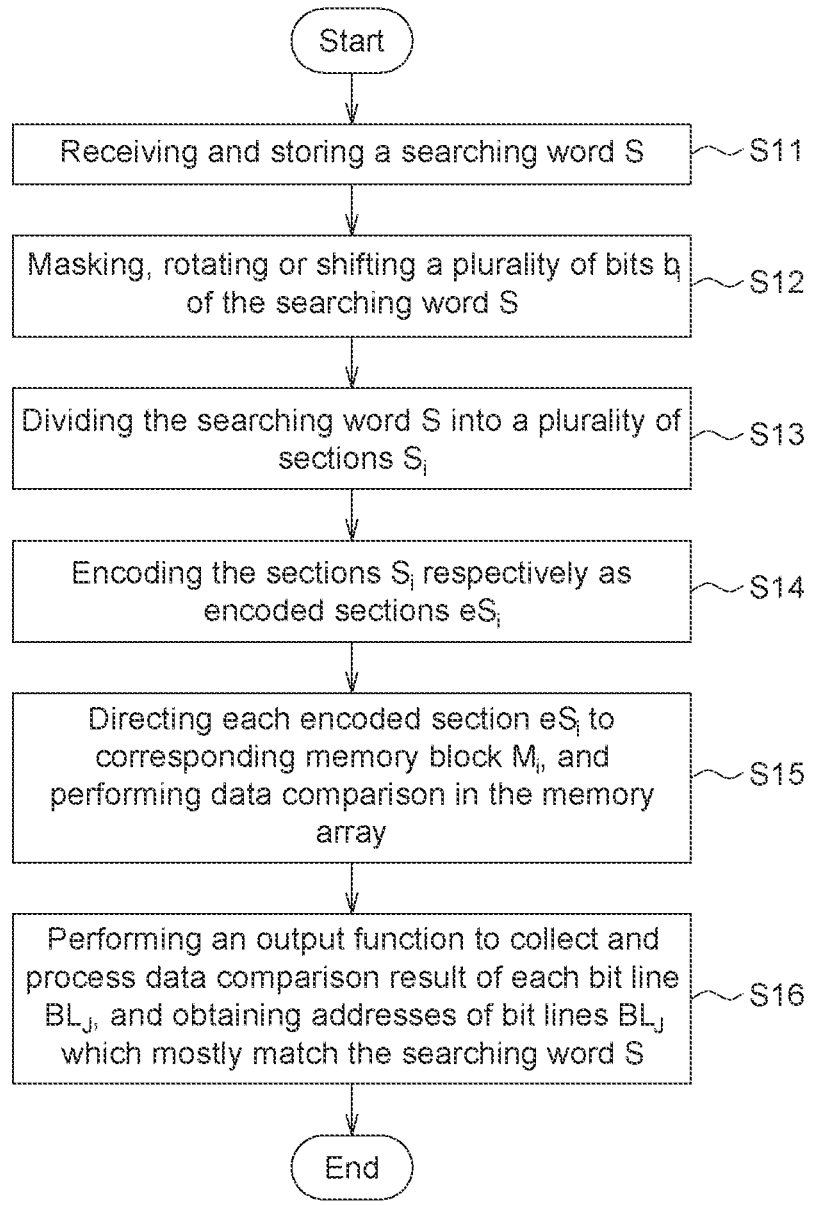
FIG. 6A is a flow diagram illustrating a data searching method for a memory device according to the present disclosure.

FIG. 6A is a flow diagram illustrating the data searching method for the memory device of the present disclosure. The data searching method of the present disclosure may include steps S11 to S16, which may substantially correspond to operation of memory device 10 shown in FIG. 1 to FIG. 5D.

Referring to FIG. 6A, first, in step S11, a searching word $S_1=\{b_1, b_2, \ldots, b_m\}$ may be received and stored, and in subsequent steps the searching word S may be performed with an input function that includes bit parsing, dividing, encoding and multiplexing.

In step S12, bit parsing may be performed on the searching word S so as to mask, rotate or shift bits in the searching word S. For example, the searching word $S=\{b_1, b_2, \ldots, b_m\}$ may be masked to form searching word $S=\{b_1, b_2, \ldots, b_{n-1}, x, x, x, b_{n+3}, \ldots, b_m\}$. Alternatively, the searching word $S=\{b_1, b_2, \ldots, b_m\}$ may be rotated to form searching word $S=\{b_{m-1}, b_m, b_1, b_2, \ldots, b_{m-2}\}$, or may be shifted to form searching word $S=\{0, 0, b_1, b_2, \ldots, b_{m-2}\}$.

Next, in step S13, the searching word S may be divided into k sections $S_1, S_2, \ldots, S_k$, where each section Si may correspond to a memory block $M_i$.

Next, in step S14, encoding may be performed so that divided sections $S_1, S_2, \ldots, S_k$ of searching word S may be converted to encoded sections $eS_1, eS_2, \ldots, eS_k$ respectively. Each encoded section $eS_i$ may comprise a pair of searching line signals $\{SeL(i), SeL(i)'\}$, which may correspond to a word line $WL_i$ in the memory block through a word line address bias.

Next, in step S15, multiplexing may be performed to direct different encoded sections $eS_1, eS_2, \ldots, eS_k$ to their corresponding memory blocks $M_1, M_2, \ldots, M_k$. Furthermore, in the memory array 11 each encoded section eSi may be compared with data of corresponding memory block Mi.

Next, in step S16, an output function may be performed to collect and process data comparison results (comparison of searching word S with each memory block Mi) for all bit lines $BL_j$. Herein, the data searching method of the present disclosure is completed. Detailed implementation of step S16 may be carried out in two embodiments as illustrated in FIGS. 6B and 6C respectively.

Figure 6B:
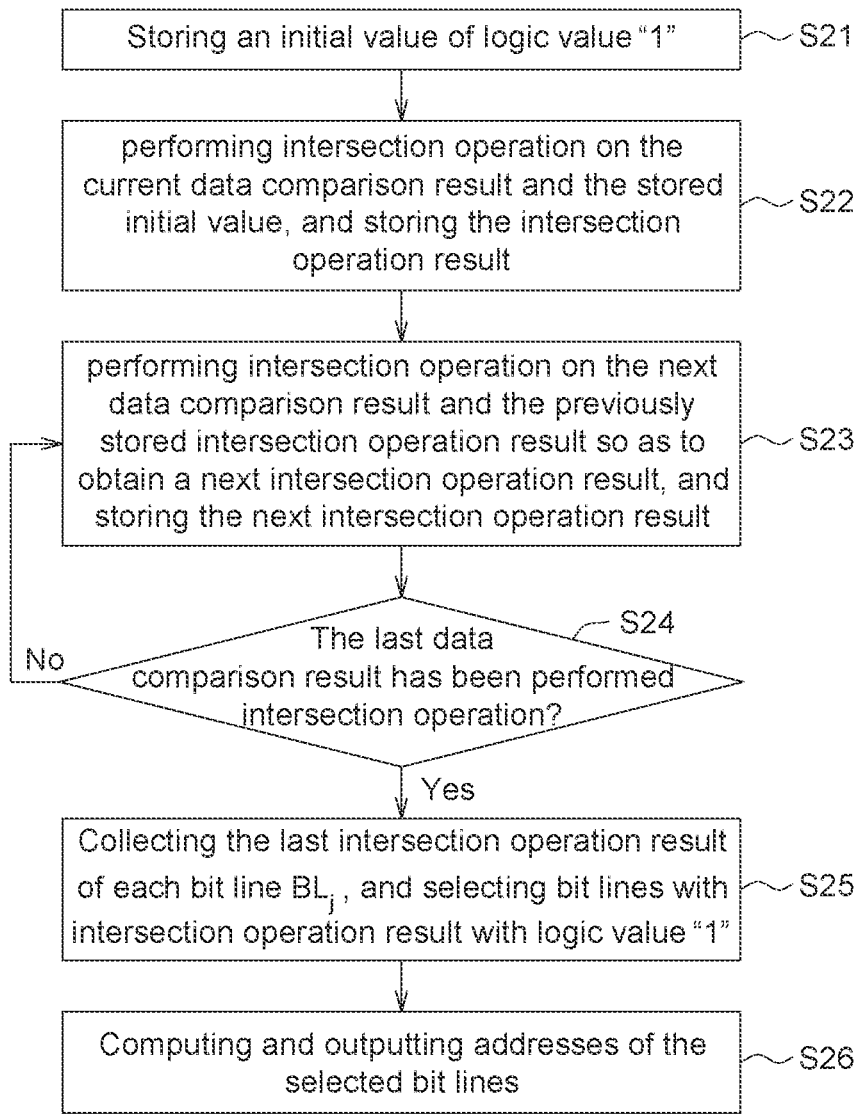
FIG. 6B illustrates the first embodiment of detailed implementations of step S16 of FIG. 6A.
Figure 6C:
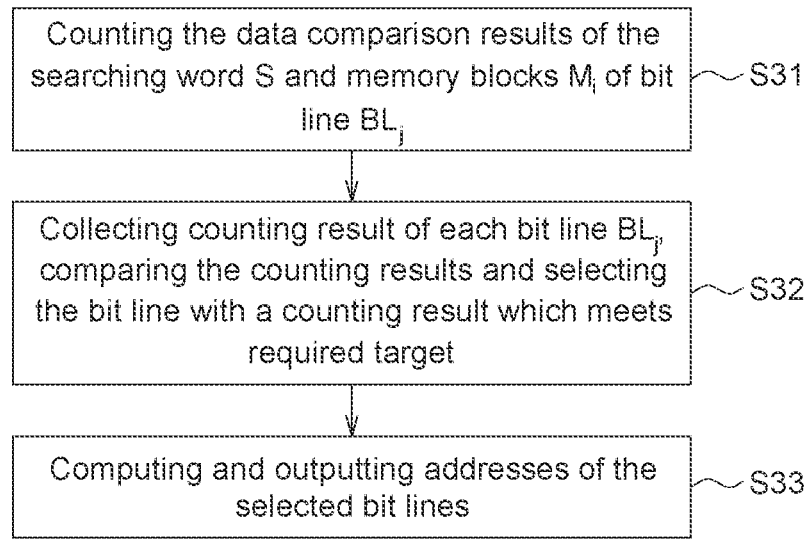
FIG. 6C illustrates the second embodiment of detailed implementations of step S16 of FIG. 6A.

Regarding the first embodiment shown in FIG. 6B, first, in step S21, an initial value may be stored. The initial value may be logical value "1".

Next, in step S22, a logic operation (i.e., AND operation) may be performed on current data comparison result of current time period (i.e., data comparison result of current encoded section $eS_1$ and current memory block $M_1$) and the stored initial value. Then, the logic operation result may be stored to replace the initial vale which has been previously stored.

Next, in step S23, a logic operation may be performed on next data comparison result of next time period (i.e., data comparison result of next encoded section $eS_2$ and next memory block $M_2$) and logic operation result which is stored in step S22, so that a next logic operation result may be obtained. Then, such an obtained next logic operation result may be stored to replace previous logic operation result which is stored previously.

Next, in step S24, it is determined whether the last data comparison result (data comparison result of the last encoded section $eS_k$ and the last memory block $M_k$) has been performed with a logic "AND" operation to obtain the last logic operation result. If it is determined as negative, step S23 may be repeated. On the other hand, if it is determined as confirmative, step S25 may be executed.

Then, in step S25, the last logic operation result stored for each bit line $BL_j$ may be collected, and the bit line with logic operation result of logical value "1" may be selected. The selected bit line completely matches or mostly matches the searching word S.

Then, in step S26, addresses of the selected bit lines may be calculated, and such addresses may then be outputted.

Now referring to FIG. 6C, and the second embodiment of detail implementations of step S16 is provided. In step S31, the output function may be performed to count the data comparison results of memory block $M_i$ and searching word S for each bit line $BL_j$.

If all the encoded sections $eS_1$, $eS_2$, $eS_3$, match memory blocks $M_1$, $M_2$, $M_3$, the counting result may be accumulated three times and hence obtaining a counting value of "three". On the other hand, if the subsequent encoded section $eS_4$ does not match memory block $M_4$, no accumulation will be performed, and the counting value may remain at "three". In other words, the output function may be performed to count the amount of memory blocks that match the searching word S.

Next, in step $S_{32}$, counting results for each bit line $BL_j$ may be collected, and the collected counting results may be compared with one another to select counting values which meet required target. Such as, selecting the highest counting value, thereby the selected bit line with the highest counting value is deemed as being mostly matching the searching word S.

Then, in step S33, addresses of the selected bit lines may be calculated, and such addresses may then be outputted.

According to the above-mentioned implementations of the present disclosure, the memory array may be divided into a plurality of memory blocks $M_i$, and the input function may be executed by the input circuit 20 to divide the searching word S into a plurality of sections $S_i$. Then, the sections Si may be encoded as encoded sections $eS_i$ which are compared with data of corresponding memory block $M_i$ respectively. In this manner, it is capable of dealing with searching word S with a greater length. Furthermore, the memory array can be divided into a plurality of memory sub-arrays, so that data comparison for such memory sub-arrays may be performed in a time-divisional and interlacing manner, and efficiency of data searching for large-sized memory array may thus be enhanced.

Moreover, the output circuit 30 of the present disclosure may be capable of integrating various types of output functions, thus can flexibly output various data comparison results.

In addition, the input circuit 20 and the output circuit 30 of the present disclosure can be employed to memory arrays with different architectures or memory types, such as NAND-string memory, floating-gate memory, charge-trapping memory or FinFET memory.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device for data searching, comprising:
   a memory array, having a plurality of memory blocks for storing data and having a plurality of bit lines, wherein the memory array is divided into a plurality of memory sub-arrays with respect to a first direction, and each of the memory sub-arrays is further divided into the memory blocks with respect to a second direction perpendicular to the first direction;

an input circuit, comprising:
- a dividing circuit, for receiving a searching word and dividing the searching word into a plurality of sections;
- an encoding circuit, for encoding the sections as a plurality of encoded sections which correspond to the memory blocks respectively; and
- a multiplexing circuit, for directing the encoded sections to the memory blocks, and data comparison is performed on each of the encoded sections with each of the memory blocks of each of the memory sub-arrays in the memory array respectively in a time-divisional and interlacing manner to obtain a data comparison result, and an output circuit, for obtaining addresses of the bit lines which match the searching word according to each of the data comparison results of each of the memory blocks.

2. The memory device of claim 1, wherein the input circuit further comprises: a bit-parsing circuit, for masking, rotating or shifting a plurality of bits of the searching word.

3. The memory device of claim 1, wherein the memory array has a plurality of word lines, and the encoded sections correspond to the memory blocks respectively through address bias conditions of the word lines.

4. A memory device for data searching, comprising:
- a memory array, having a plurality of memory blocks for storing data and having a plurality of bit lines;
- an input circuit, for receiving and processing a searching word and directing the processed searching word to the memory blocks, and data comparison is performed on the processed searching word with the memory blocks in the memory array to obtain a plurality of data comparison results; and
- an output circuit, comprising:
  - a plurality of processing circuits, corresponding to the bit lines respectively for processing each of the data comparison results of each of the memory blocks with respect to each of the bit lines, wherein each of the processing circuits comprises:
    - a counter, corresponding to each of the bit lines for counting an amount of the memory blocks which match the searching word and obtaining a counting result; and
  - a selecting circuit, for collecting and processing each of the data comparison results of each of the bit lines, and obtaining addresses of the bit lines which match the searching word according to each of the data comparison results with respect to each of the bit lines.

5. The memory device of claim 4, wherein each of the processing circuits comprises:
- a register, for storing a logic value, the logic value is updated in different time periods; and
- a logic gate, for performing a logic "AND" operation on the logic value stored in the register with the data comparison result in a current time period with respect to the bit line to obtain an logic operation result, and restoring the logic operation result to the register to update the logic value stored in the register in the current time period.

6. The memory device of claim 5, wherein the selecting circuit selects the registers with logic value "1" and obtains addresses of the bit lines which completely match the searching word.

7. The memory device of claim 4, wherein the selecting circuit selects the counting result of each of the counters with the highest value and obtains addresses of the bit lines which mostly match the searching word.

8. A data searching method for a memory device, comprising:
- receiving a searching word and dividing the searching word into a plurality of sections;
- encoding the sections as a plurality of encoded sections which correspond to a plurality of memory blocks of a memory array respectively, the memory array has a plurality of bit lines;
- dividing the memory array into a plurality of memory sub-arrays with respect to a first direction;
- dividing each of the memory sub-arrays into the memory blocks with respect to a second direction perpendicular to the first direction;
- directing the encoded sections to the memory blocks;
- in the memory array, performing data comparison on each of the encoded sections with each of the memory blocks of each of the memory sub-arrays respectively in a time-divisional and interlacing manner to obtain a data comparison result; and
- obtaining addresses of the bit lines which match the searching word according to each of the data comparison results of each of the memory blocks.

9. The data searching method of claim 8, wherein, prior to the step of dividing the searching word into a plurality of sections, further comprises:
- masking, rotating or shifting a plurality of bits of the searching word.

10. The data searching method of claim 8, wherein the memory array has a plurality of word lines, and the step of directing the encoded sections to the memory blocks respectively further comprises:
- corresponding the encoded sections to the memory blocks respectively through address bias conditions of the word lines.

11. A data searching method for a memory device, comprising:
- receiving and processing a searching word;
- directing the processed searching word to a plurality of memory blocks of a memory array, wherein the memory array has a plurality of bit lines;
- with respect to each of the bit lines, performing data comparison on the processed searching word with the memory blocks to obtain a plurality of data comparison results;
- collecting and processing each of the data comparison results of each of the bit lines wherein, with respect to each of the bit lines, counting an amount of the memory blocks which match the searching word to obtain a counting result; and
- obtaining addresses of the bit lines which match the searching word according to each of the data comparison results with respect to each of the bit lines.

12. The data searching method of claim 11, wherein, the step of collecting and processing each of the data comparison results of each of the bit lines further comprises:
- with respect to each of the bit lines, storing a logic value and updating the logic value in different time periods;
- with respect to each of the bit lines, performing a logic "AND" operation on the stored logic value with the data comparison results in a current time period to obtain an logic operation result; and
- restoring the logic operation result to update the stored logic value in the current time period.

13. The data searching method of claim 12, further comprises:
   selecting the bit lines with logic value "1" and obtaining addresses of the bit lines which completely match the searching word.

14. The data searching method of claim 11, further comprises:
   selecting the counting result of each of the bit lines with the highest value and obtaining addresses of the bit lines which mostly match the searching word.

* * * * *